(12) United States Patent
Wurm et al.

(10) Patent No.: US 7,078,134 B2
(45) Date of Patent: Jul. 18, 2006

(54) PHOTOLITHOGRAPHIC MASK HAVING A STRUCTURE REGION COVERED BY A THIN PROTECTIVE COATING OF ONLY A FEW ATOMIC LAYERS AND METHODS FOR THE FABRICATION OF THE MASK INCLUDING ALCVD TO FORM THE THIN PROTECTIVE COATING

(75) Inventors: Stefan Wurm, Dublin, CA (US); Siegfried Schwarzl, Neubiberg (DE)

(73) Assignee: INfineon Technologies AG, Munich (DE)

( * ) Notice: Subject to any disclaimer, the term of this patent is extended or adjusted under 35 U.S.C. 154(b) by 197 days.

(21) Appl. No.: 10/442,739

(22) Filed: May 21, 2003

(65) Prior Publication Data

US 2003/0232256 A1    Dec. 18, 2003

(30) Foreign Application Priority Data

May 21, 2002   (DE) ................................ 102 23 113

(51) Int. Cl.
  *G03F 1/14* (2006.01)
  *G03F 1/08* (2006.01)
  *G21K 5/00* (2006.01)
(52) U.S. Cl. .............................. 430/5; 378/35; 430/961
(58) Field of Classification Search .................. 430/5, 430/311, 320–321, 961, 966; 378/34–35; 216/12; 359/361, 883–884
See application file for complete search history.

(56) References Cited

U.S. PATENT DOCUMENTS

| | | | |
|---|---|---|---|
| 5,304,437 A | | 4/1994 | Tennant |
| 5,740,228 A | | 4/1998 | Schmidt et al. |
| 5,851,849 A | * | 12/1998 | Comizzoli et al. ............ 438/38 |
| 5,928,817 A | * | 7/1999 | Yan et al. ....................... 430/5 |
| 5,935,733 A | * | 8/1999 | Scott et al. ..................... 430/5 |
| 6,709,791 B1 | * | 3/2004 | Mohri et al. ................... 430/5 |
| 2003/0001176 A1 | * | 1/2003 | Li et al. ....................... 257/295 |

FOREIGN PATENT DOCUMENTS

| | | |
|---|---|---|
| CA | 2287671 | 4/2001 |
| DE | 38 42 481 A1 | 6/1989 |

* cited by examiner

*Primary Examiner*—S. Rosasco
*Assistant Examiner*—John Ruggles
(74) *Attorney, Agent, or Firm*—Laurence A. Greenberg; Werner H. Stemer; Ralph E. Locher

(57) ABSTRACT

A photolithographic mask for patterning a photosensitive material, in particular on a wafer, has at least one structure region for imaging a structure on the photosensitive material, and an absorber structure for absorbing incident radiation. At least one structure region is provided and has at least one thin protective coating of only a few atomic layers made of chemically and mechanically resistive material selected from $Al_2O_3$, $Ta_2O_5$, $ZrO_2$, and $HfO_2$ formed by atomic layer chemical vapor deposition (ALCVD) so that the protective coating constitutes a negligible alteration of nominal or critical dimensions for the structure region, and in which additional absorption or reflection losses are negligibly low. In this way, the photolithographic mask can be cleaned chemically and/or mechanically, without the structure regions being attacked and damaged by the chemical and/or mechanical cleaning media. Furthermore, a plurality of methods are possible for fabricating this photolithographic mask.

19 Claims, 3 Drawing Sheets

PHOTOLITHOGRAPHIC MASK HAVING A STRUCTURE REGION COVERED BY A THIN PROTECTIVE COATING OF ONLY A FEW ATOMIC LAYERS AND METHODS FOR THE FABRICATION OF THE MASK INCLUDING ALCVD TO FORM THE THIN PROTECTIVE COATING

BACKGROUND OF THE INVENTION

Field of the Invention

The present invention relates to a photolithographic mask for patterning a photosensitive material, in particular on a wafer, having at least one structure region for imaging a structure on the photosensitive material, and an absorber structure for absorbing incident radiation. Furthermore, the invention relates to various methods for fabricating a photolithographic mask of this type.

Photolithographic masks of this type serve for patterning a photosensitive material, in particular on a wafer. The masks have at least one structure region for imaging a structure on the photosensitive material and an absorber structure for absorbing incident radiation.

In order to image the structure regions of the mask onto the plane of a wafer coated with photoresist, the mask is irradiated with light. The smaller the structures to be imaged are, the shorter, too, the wavelength of the irradiation light has to be in order that the resolution, limited by diffraction, can be increased. Wavelengths in the deep ultraviolet (DUV), e.g. 248 nm and 193 nm, are used nowadays for chip fabrication. Lithography in the vacuum ultraviolet (VUV) region (e.g. 157 nm) and in the extreme ultraviolet (EUV) region (e.g. 13–14 nm) will be used in the future.

In chip production, a photolithographic mask has to be available for the exposure of thousands of wafers with sufficient quality. This poses the problem that the patterned surface of the mask has to be protected from contamination in particular by particles.

For exposures in the DUV, use is made of transparent and stable membranes—so-called pellicles—that are clamped over the mask and thereby protect the structures to be imaged from particle deposition during exposure, transport and storage. The distance between the pellicles and the mask surface additionally has the effect that particles deposited thereon lie outside the depth of the focus range and are not imaged on the wafer.

As the wavelength of the exposure light decreases, it is becoming increasingly difficult to find materials that have a high transparency and at the same time exhibit sufficient long-term stability. For so-called 157 nm lithography, no suitable membranes have been found hitherto; therefore, hard pellicles made of e.g. $CaF_2$ with a thickness of about 800 µm are necessary, but these have to be taken into account as an optical element in the configuration of the optical beam path.

For EUV lithography (EUVL) in the wavelength range of 13–14 nm, there are practically no materials that are optically transparent and at the same time mechanically stable enough to be suitable as a membrane material for a pellicle.

Moreover, in EUVL, transmission masks can no longer be used, rather reflection masks are necessary. In this case, the light used for imaging would have to pass through a membrane not just once but twice. On account of the smaller structures of EUVL in relation to 157 nm or 197 nm lithography, the requirements with regard to the mask surface being free of particles are very much more stringent.

Since there are no suitable membranes available, the surfaces of such masks have to be cleaned of particles that would be imaged on the wafers. Each cleaning operation may entail damage to the structure regions and the absorber structures. This leads to undesirable and unacceptable deviations of the imaged structures from the desired structures.

SUMMARY OF THE INVENTION

It is accordingly an object of the invention to provide a photolithographic mask and methods for the fabrication of the mask that overcome the above-mentioned disadvantages of the prior art devices and methods of this general type.

With the foregoing and other objects in view there is provided, in accordance with the invention, a photolithographic mask for patterning a photosensitive material. The mask contains at least one structure region for imaging a structure on the photosensitive material, at least one protective layer made of a chemically and mechanically resistive material disposed on the structure region, and an absorber structure for absorbing incident radiation disposed next to the structure region.

The invention provides for at least one structure region of the photomask to have at least one protective layer made of a chemically and mechanically resistive material.

In this way, the photolithographic mask can be cleaned chemically and/or mechanically, without the structure regions being attacked and damaged by the chemical and/or mechanical cleaning media.

Suitable liquid etchants or reactive gases are usually used during chemical cleaning. In mechanical cleaning methods, the patterned surface of the photomask is exposed to mechanical forces or impulses by gaseous, liquid or solid media. These include, by way of example, rinsing operations in a neutral liquid with or without ultrasonic assistance, brush methods, jet and plasma methods in which the surface is exposed to a liquid jet or bombardment with solid particles, e.g. chemically inert ions.

Therefore, in the case of photomasks whose surfaces have hitherto been protected by pellicles, the solution according to the invention allows such pellicles to be dispensed with.

The number of wafers that can be exposed by photomasks configured according to the invention for reflection exposure is similar to that using known photomasks whose surfaces are protected by a pellicle.

At least one protective layer can preferably be fabricated by a method for atomic layer deposition. Such methods enable the deposition of layers that are very thin, i.e. have just a few atomic layers. Moreover, these layers can be deposited highly conformally onto arbitrary surface topographies, and they have no holes (pinholes) whatsoever despite their small layer thickness.

The deposition of such thin protective layers either constitutes a negligible alteration of the desired nominal dimensions (the so-called critical dimensions (CD)) of the surface topographies particularly in the case of EUVL photomasks or can be compensated for through corresponding modifications of the absorber structure dimensions before the deposition of the thin protective layers. Moreover, the additional absorption and reflection losses are likewise negligibly low.

Such a protective layer having a thickness of a few atomic layers enables multiple chemical and/or mechanical cleaning of photomasks that are provided for EUV lithography.

The so-called atomic layer chemical vapor deposition (ALCVD) method has proved to be a particularly suitable method for atomic layer deposition. It has the above-mentioned properties during the layer deposition and enables very precise control of the deposition process.

A preferred embodiment of the photomask is characterized in that the protective layer additionally extends over the surfaces of an absorber structure. Consequently, the protective layer completely seals the surface topography of the photomask. In addition to the structure regions, the surfaces of the three-dimensional absorber structure are also protected from an interaction with the respective cleaning media during chemical and/or mechanical cleaning.

The protective layer is formed of at least one material being $Al_2O_3$, $Ta_2O_5$, $ZrO_2$ and/or $HfO_2$. Deviations from the specified stoichiometric compositions are also possible in this case. These materials afford the desired resistance to chemical and/or mechanical cleaning media and can be deposited as a thin film by atomic deposition methods described above.

For the transmission exposure of photosensitive materials, in particular on wafers, the structure regions and the absorber structure of the photolithographic mask are disposed on a carrier element suitable for a transmission exposure. With the use of ultraviolet radiation having wavelengths in the region above 100 nm, quartz glass is usually appropriate as material for the carrier element.

For the reflection exposure of photosensitive materials, in particular on wafers, the structure regions and the absorber structure of the photolithographic mask are preferably disposed on a carrier element that has a reflection device for reflecting the exposure radiation during the reflection exposure.

Particularly with the use of an exposure radiation having a wavelength of less than 20 nm, it is advantageous for the reflection device to be configured as a Bragg reflector.

The Bragg reflector contains, for example, an alternating sequence of two thin films having a defined layer thickness and refractive index. For EUVL, molybdenum and silicon, for example, are suitable as materials for the two thin films. The thin films of the Bragg reflector are usually deposited on a substrate having a low thermal expansion coefficient.

In a preferred embodiment, the absorber structure is disposed on a buffer layer. The buffer layer serves as an etching stop during the anisotropic patterning of the absorber layer and protects the structure regions during defect repairs of the absorber structure. After the operation for repairing the absorber layer, the buffer layer is removed from the structure regions. Silicon oxide, in particular, is suitable as material for a repair buffer layer of this type.

The absorber structure of the photolithographic mask preferably contains at least one of the following materials: Al, Cu, Ti, TiN, Ta, TaN, Ni and Cr.

A first method for fabricating a photolithographic mask according to the invention for patterning a photosensitive material, in particular on a wafer, contains the following steps: provision of a carrier element, deposition of at least one protective layer made of a chemically and mechanically resistive material using a method of atomic layer deposition on a surface of the carrier element, and fabrication of an absorber structure on the surface of the protective layer by deposition and patterning of an absorber layer.

The method provides a fabrication method for a photomask according to the invention whose structure regions are protected from an interaction and damage with chemical and/or mechanical cleaning media by a protective layer.

A second method for fabricating a photolithographic mask according to the invention for patterning a photosensitive material, in particular on a wafer, contains the following steps: provision of a carrier element, deposition of at least one protective layer made of a chemically and mechanically resistive material using a method for atomic layer deposition on a surface of the carrier element, deposition of a buffer layer on the surface of the protective layer, fabrication of an absorber structure on the surface of the buffer layer by deposition and patterning of an absorber layer, repair of the absorber structure if necessary, and removal of the buffer layer in structure regions that are not covered by the absorber structure, by anisotropic etching, the protective layer serving as an etching stop.

In this method, the absorber structure of the photomask has an additional buffer layer. During the fabrication process, the buffer layer preserves the structure regions together with the thin protective layer disposed thereon from damage during the patterning and repair operation for the absorber layer. In the sections of the structure regions the buffer layer can be completely removed in a simple manner by an anisotropic etching process because the underlying protective layer acts as an etching stop.

An advantageous development of the first or second fabrication method provides for an additional protective layer made of a chemically and mechanically resistive material to be deposited by atomic layer deposition on the surfaces of the absorber structure and on the surfaces of the first protective layer in the structure regions. A complete sealing of the surface topography is achieved as a result.

A third method for fabricating a photolithographic mask for patterning a photosensitive material, in particular on a wafer, contains the following steps: provision of a carrier element, fabrication of an absorber structure by deposition and patterning of an absorber layer on the surface of the carrier element, and deposition of at least one protective layer made of a chemically and mechanically resistive material by atomic layer deposition on the surface of the absorber structure and on the surface of the carrier element in the structure regions.

In this method, as the last method step, the protective layer seals the entire surface topography of the photolithographic mask.

A fourth method for fabricating a photolithographic mask for patterning a photosensitive material, in particular on a wafer, contains the following steps: provision of a carrier element, deposition of a buffer layer on a surface of the carrier element, fabrication of an absorber structure on the surface of the buffer layer by deposition and patterning of an absorber layer, repair of the absorber structure, removal of the buffer layer in structure regions that are not covered by the absorber structure, by anisotropic etching, and deposition of at least one protective layer made of a chemically and mechanically resistive material by atomic layer deposition on the surface of the absorber structure and on the surface of the carrier element in the structure regions.

In a manner similar to that in the case of the second fabrication method, the absorber structure has an additional buffer layer disposed on the carrier element. The buffer layer fulfils the protective function already explained during the repair of the absorber structure and is subsequently removed in the sections of the structure regions by anisotropic etching.

In all four fabrication methods, at least one protective layer is preferably deposited by an ALCVD method.

In all the above-described methods for fabricating the photomask according to the invention, it is possible to provide both a carrier element made of a material suitable for a transmission exposure and a carrier element with a reflection device for a reflection exposure.

Other features which are considered as characteristic for the invention are set forth in the appended claims.

Although the invention is illustrated and described herein as embodied in a photolithographic mask and methods for the fabrication of the mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
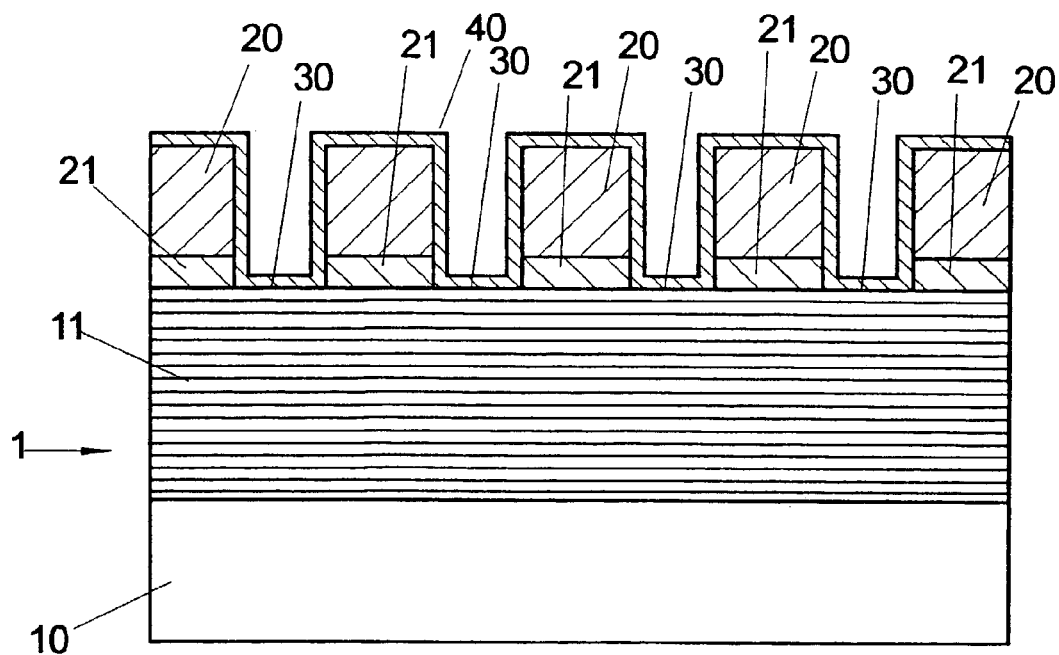
FIG. 1A is a diagrammatic, sectional view, not to scale, of a first embodiment of a photomask according to the invention with a reflection device configured as a Bragg reflector for a reflection exposure.

Referring now to the figures of the drawing in detail and first, particularly, to FIG. 1 thereof, there is shown a planar carrier element 1 of a mask, also called a mask blank. The planar carrier element 1 has a substrate 10 and a reflection device 11 that is disposed thereon and is configured as a Bragg reflector 11 in a known manner. The Bragg reflector 11 has a multilayer reflector layer with a multiplicity of alternating thin films, for which molybdenum and silicon, in particular, are suitable as materials in the application for EUVL.

An absorber structure 20 is disposed in the form of a regular rib structure on a surface of the Bragg reflector 11. In this case, those regions of the carrier element 1 which are not covered by the absorber structure form the structure regions 30, which can be imaged onto a photosensitive material, for example onto a wafer coated with photoresist, by the photomask. The periodic rib structure shown is chosen here only by way of example; it is clear that the absorber structure 20 can be formed in a multiplicity of different topographies.

A buffer layer 21 is situated in each case between the surface of the Bragg reflector 11 and the individual absorber structures 20. The buffer layer 21 was deposited during the fabrication process initially on the entire surface of the Bragg reflector 11. After the fabrication of the absorber structure 20 on the buffer layer 21, it ensures that the surface of the Bragg reflector 11 is not damaged during a mechanical or laser-optical repair operation for the absorber structure 20. After the repair of the absorber structure 20, the buffer layer 21 is removed by an anisotropic etching process in the sections of the structure regions 30.

In the case of the photomask illustrated in FIG. 1A, the surfaces of the absorber structure 20 and of the structure regions 30 have a common protective layer 40. The protective layer 40 seals the entire surface topography of the photomask and protects the absorber structure 20 and the structure regions 30 from contact with and damage due to chemical and/or mechanical cleaning media.

The protective layer 40 can preferably be deposited by an atomic layer deposition method, in particular ALCVD method, on the surface topography. These methods have the advantage that the surface topography is sealed with a highly conformal, etching and sputtering-resistant protective layer having a thickness of only a few atomic layers. The sputtering resistance is of importance primarily in the case of EUVL photomasks, since the light having the wavelengths used gives rise, by way of secondary-electron-induced processes, to highly excited particles that, through interaction with the unsealed surface of the photomask, can lead to damage thereto.

With regard to the illustration in all the figures, it must be emphasized that the dimensions of the individual layers with respect to one another are not illustrated true to scale. The illustrations are diagrammatic, therefore, in order to be able to clearly illustrate the construction of the photomasks.

Figure 1B:
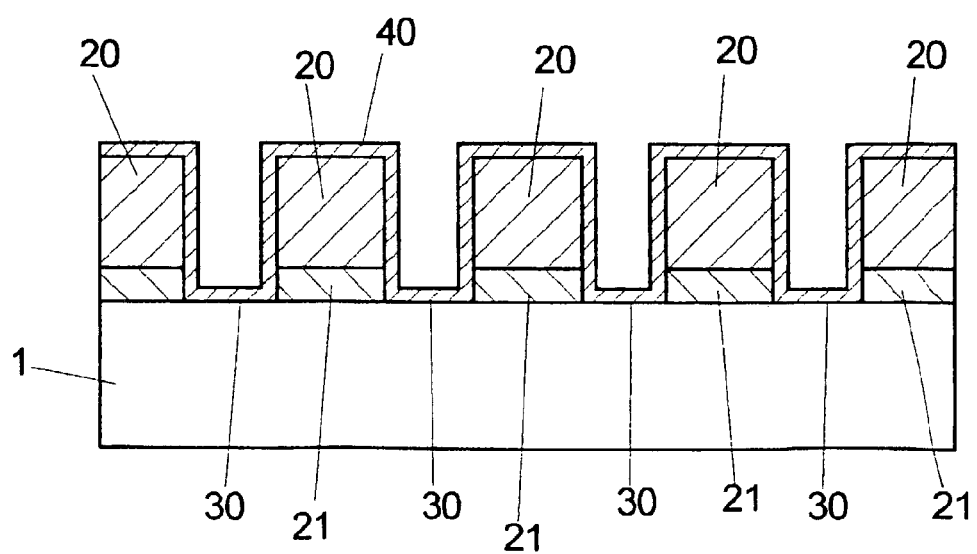
FIG. 1B is a sectional view of the photomask from FIG. 1A, the photomask having a carrier element without the Bragg reflector for a transmission exposure.

The photomask illustrated in FIG. 1B has the same construction as described in connection with FIG. 1A with regard to the absorber structure 20 and the structure regions 30.

In contrast to FIG. 1A, the carrier element 1 of the photomask does not have a reflection device. The photomask is configured for a transmission exposure of photosensitive material. Therefore, the carrier element 1 is composed of a material that has sufficient transmission for light having the wavelength used for the exposure.

Figure 2A:
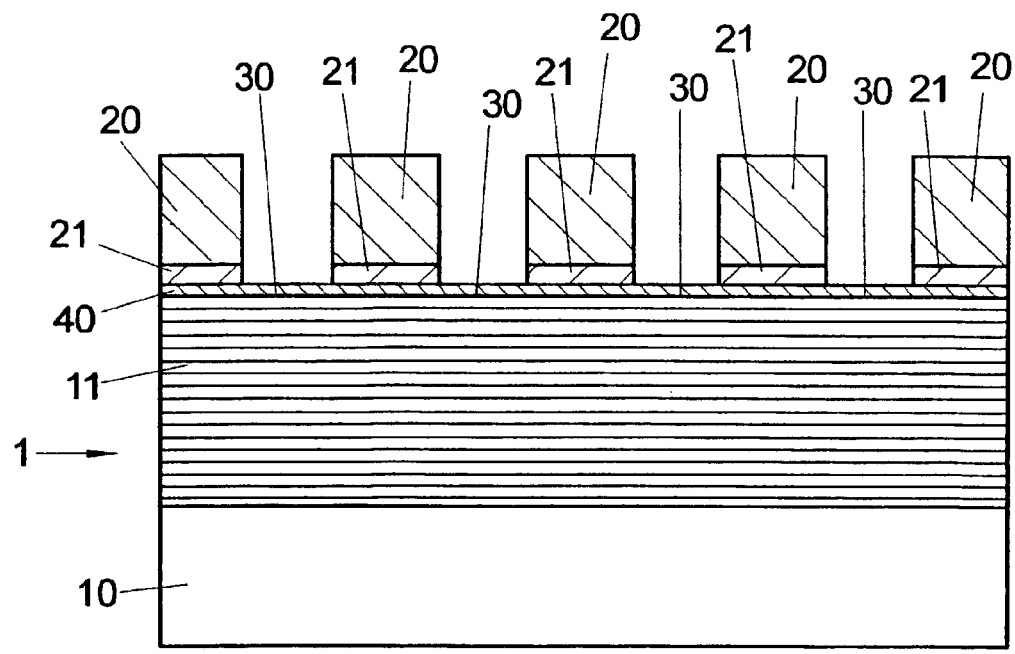
FIG. 2A is a diagrammatic, sectional view, not to scale, of a second embodiment of the photomask according to the invention with the reflection device configured as a Bragg reflector for a reflection exposure.

FIG. 2A shows a second embodiment of the photomask according to the invention. Identical elements are provided with identical reference symbols. In contrast to the first embodiment, the protective layer 40 is disposed on the surface of the Bragg reflector 11. During the fabrication of the photomask of this embodiment, the buffer layer 21 and the absorber structure 30 were deposited successively on the surface of the protective layer 40. The buffer layer 21, as described in connection with FIG. 1A, was subsequently removed in the structure regions 30 by an anisotropic etching step. The protective layer 40 serves as an etching stop in this case.

Figure 2B:
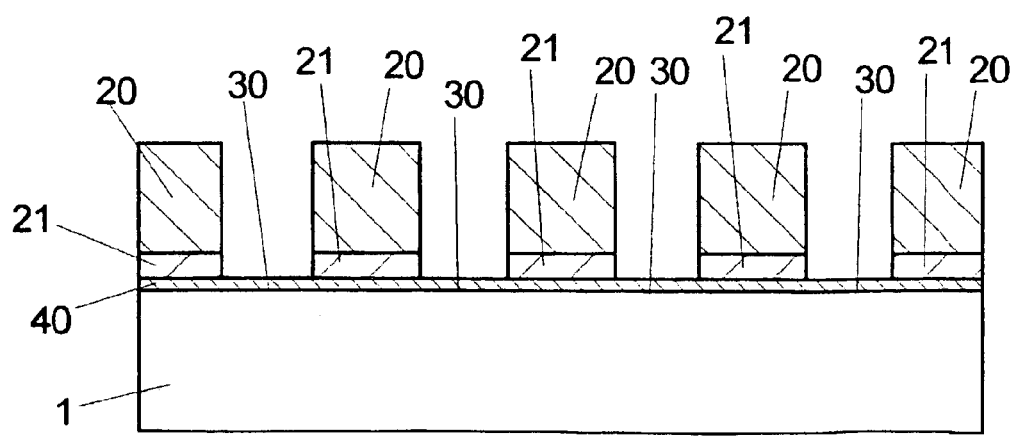
FIG. 2B is a sectional view of the photomask from FIG. 2A, the photomask having the carrier element without the Bragg reflector for a transmission exposure.

FIG. 2B shows the photomask with a construction as in FIG. 2A, the carrier element 1 not having a reflection device and being composed of a material suitable for the transmission exposure.

Figure 3A:
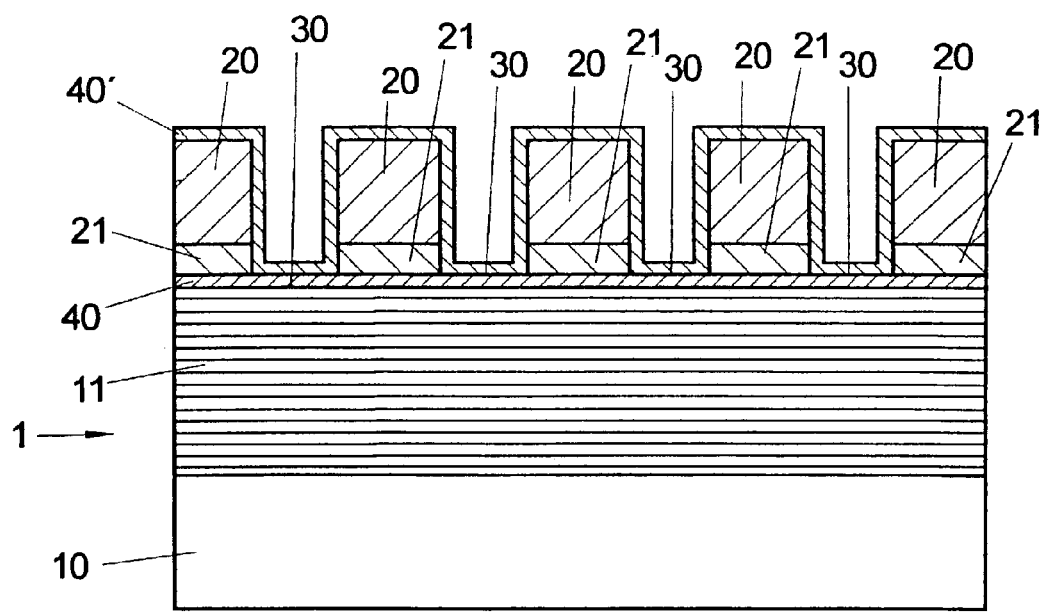
FIG. 3A is a diagrammatic, sectional view, not to scale, of a third embodiment of the photomask according to the invention with the reflection device configured as a Bragg reflector for a reflection exposure.

FIG. 3A shows a third embodiment of the photomask according to the invention. With regard to its construction and its fabrication, this embodiment corresponds to the photomask shown in FIG. 2A, the photomask having an additional second protective layer 40' on the surfaces of the absorber structure 20 and on the surfaces of the first protective layer 40 in the structure regions 30. The additional second protective layer 40' can be formed from the same material as the first protective layer 40 or from a different material. It is again fabricated by a method for atomic layer deposition, in particular by ALCVD.

Figure 3B:
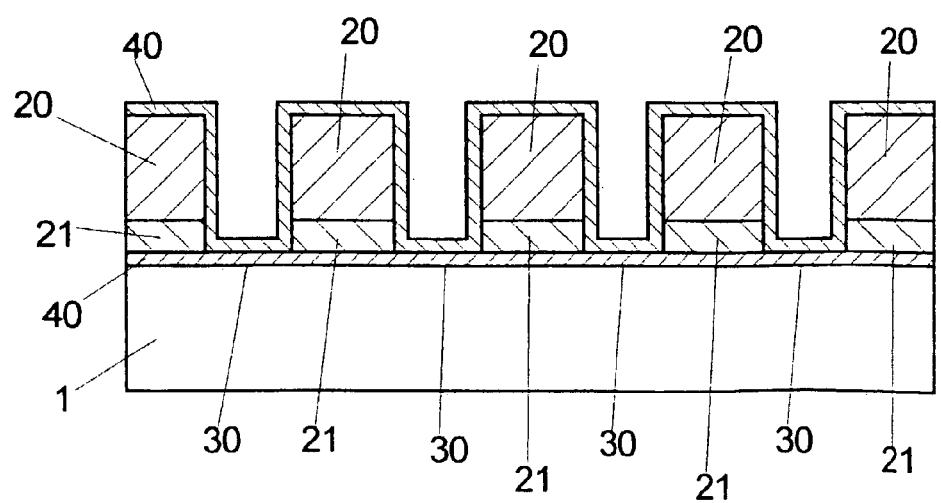
FIG. 3B is a sectional view of the photomask from FIG. 3A, the photomask having the carrier element without the Bragg reflector for a transmission exposure.

FIG. 3B shows the photomask with the same construction as in FIG. 3A, the carrier element 1 not having a reflection device and being composed of a material suitable for the transmission exposure.

We claim:

1. A photolithographic mask for patterning a photosensitive material, comprising:
   at least one structure region for imaging a structure on the photosensitive material;
   at least one protective layer made of a chemically and mechanically resistive material disposed on said structure region; and
   an absorber structure for absorbing incident radiation disposed next to said structure region;
   said protective layer being made of a thin coating having only a few atomic layers deposited by an atomic layer chemical vapor deposition process so that said protective layer constitutes a negligible alteration of nominal or critical dimensions for the structure region and the absorber structure, and in which additional absorption or reflection losses are negligibly low;
   said protective layer including at least one material selected from the group consisting of $Al_2O_3$, $Ta_2O_5$, $ZrO_2$ and $HfO_2$.

2. The photolithographic mask according to claim 1, wherein said protective layer additionally extends over surfaces of said absorber structure.

3. The photolithographic mask according to claim 1, further comprising a carrier element suitable for a transmission exposure of the photosensitive material, said structure region and said absorber structure are disposed on said carrier element.

4. The photolithographic mask according to claim 1, further comprising a carrier element with a reflection device for reflection exposure of the photosensitive material, said structure region and said absorber structure are disposed on said carrier element.

5. The photolithographic mask according to claim 4, wherein said reflection device is a Bragg reflector for electromagnetic radiation having a wavelength of less than 20 nm.

6. The photolithographic mask according to claim 3, wherein said absorber structure has a buffer layer disposed on a surface of said carrier element.

7. The photolithographic mask according to claim 1, wherein said absorber structure contains at least one material selected from the group consisting of Al, Cu, Ti, TiN, Ta, TaN, Ni and Cr.

8. The photolithographic mask according to claim 1, wherein the photosensitive material is disposed on a wafer.

9. The photolithographic mask according to claim 4, wherein said absorber structure has a buffer layer disposed on a surface of said carrier element.

10. A method for fabricating a photolithographic mask for patterning a photosensitive material, which comprises the following steps:
    providing a carrier element;
    depositing at least one protective layer made of a chemically and mechanically resistive material using an atomic layer chemical vapor deposition process on a surface of the carrier element, the protective layer being made of a thin coating having only a few atomic layers and including at least one material selected from the group consisting of $Al_2O_3$, $Ta_2O_5$, $ZrO_2$ and $HfO_2$, so that the protective layer constitutes a negligible alteration of nominal or critical dimensions for an absorber structure, and in which additional absorption or reflection losses are negligibly low; and fabricating the absorber structure, on a surface of the protective layer by deposition and patterning an absorber layer.

11. The method according to claim 10, which further comprises providing the photosensitive material on a wafer.

12. The method according to claim 10, which further comprises depositing an additional protective layer made of a further chemically and mechanically resistive material using the atomic layer deposition process on surfaces of the absorber structure and on the surface of the protective layer.

13. A method for fabricating a photolithographic mask for patterning a photosensitive material, which comprises the following steps:
    providing a carrier element;
    depositing at least one protective layer made of a chemically and mechanically resistive material using an atomic layer chemical vapor deposition process on a surface of the carrier element, the protective layer being made of a thin coating having only a few atomic layers and including at least one material selected from the group consisting of $Al_2O_3$, $Ta_2O_5$, $ZrO_2$ and $HfO_2$, so that the protective layer constitutes a negligible alteration of nominal or critical dimensions for an absorber structure, and in which additional absorption or reflection losses are negligibly low;
    depositing a buffer layer on a surface of the protective layer;
    fabricating the absorber structure on a surface of the buffer layer by deposition and patterning an absorber layer;
    repairing the absorber structure; and
    removing the buffer layer in structure regions that are not covered by the absorber structure, by anisotropic etching, the protective layer serving as an etching stop.

14. The method according to claim 13, which further comprises depositing an additional protective layer made of a further chemically and mechanically resistive material using the atomic layer deposition process on surfaces of the absorber structure and on the surface of the protective layer.

15. The method according to claim 13, which further comprises providing the photosensitive material on a wafer.

16. A method for fabricating a photolithographic mask for patterning a photosensitive material, which comprises the following steps:
    providing a carrier element;
    fabricating an absorber structure by depositing and patterning an absorber layer on a surface of the carrier element; and
    depositing at least one protective layer made of a chemically and mechanically resistive material using an atomic layer chemical vapor deposition process on surfaces of the absorber structure and on surfaces of the carrier element, the protective layer being made of a thin coating having only a few atomic layers and including at least one material selected from the group consisting of $Al_2O_3$, $Ta_2O_5$, $ZrO_2$ and $HfO_2$, so that the protective layer constitutes a negligible alteration of nominal or critical dimensions for the absorber structure and the carrier element, and in which additional absorption or reflection losses are negligibly low.

17. The method according to claim 16, which further comprises providing the photosensitive material on a wafer.

18. A method for fabricating a photolithographic mask for patterning a photosensitive material, which comprises the following steps:

providing a carrier element;

depositing a buffer layer on a surface of the carrier element; fabricating an absorber structure on a surface of the buffer layer by depositing and patterning an absorber layer;

repairing the absorber structure;

removing the buffer layer in structure regions that are not covered by the absorber structure, by anisotropic etching; and depositing at least one protective layer made of a chemically and mechanically resistive material using an atomic layer chemical vapor deposition process on surfaces of the absorber structure and of the carrier element in the structure regions, the protective layer being made of a thin coating having only a few atomic layers and including at least one material selected from the group consisting of $Al_2O_3$, $Ta_2O_5$, $ZrO_2$ and $HfO_2$, so that the protective layer constitutes a negligible alteration of nominal or critical dimensions for the absorber structure and the carrier element in the structure regions, and in which additional absorption or reflection losses are negligibly low.

19. The method according to claim 18, which further comprises providing the photosensitive material on a wafer.

* * * * *